United States Patent [19]

Barry

[11] Patent Number: 4,608,667

[45] Date of Patent: Aug. 26, 1986

[54] DUAL MODE LOGIC CIRCUIT FOR A MEMORY ARRAY

[75] Inventor: Robert L. Barry, Pleasant Valley, N.Y.

[73] Assignee: International Business Machines Corporation, Armonk, N.Y.

[21] Appl. No.: 611,564

[22] Filed: May 18, 1984

[51] Int. Cl.⁴ .................. G11C 7/00; H03K 19/086
[52] U.S. Cl. ................... 365/189; 365/179; 365/242; 307/455; 307/467
[58] Field of Search ............. 365/189, 155, 179, 242; 307/455, 467, 299 A, 239, 241, 242, 244, 454, 466

[56] References Cited

U.S. PATENT DOCUMENTS

| | | | |
|---|---|---|---|
| 3,333,113 | 7/1967 | Cole | 307/269 |
| 3,446,989 | 5/1969 | Allen | 307/454 |
| 3,539,824 | 11/1970 | Yu et al. | 307/455 |
| 3,681,614 | 8/1972 | Kroos | 307/455 |
| 3,789,243 | 1/1974 | Donofrio | 365/191 |
| 3,906,212 | 9/1975 | Poguntke | 364/784 |
| 3,925,691 | 12/1975 | Gaskill | 307/455 |
| 3,942,033 | 3/1976 | Swiatowiec | 307/455 |
| 4,007,384 | 2/1977 | Brooks | 307/455 |
| 4,066,915 | 1/1978 | Ohhinata | 365/189 |
| 4,070,657 | 1/1978 | Fett | 365/233 |
| 4,099,070 | 5/1978 | Reinert | 365/191 |
| 4,110,639 | 8/1978 | Redwine | 307/279 |
| 4,125,877 | 11/1978 | Reinert | 365/190 |
| 4,149,099 | 4/1979 | Nagami | 307/279 |
| 4,215,418 | 5/1980 | Muramatsu | 364/757 |
| 4,274,017 | 6/1981 | Carter | 307/289 |
| 4,280,070 | 7/1981 | Reese | 307/279 |
| 4,540,900 | 9/1985 | Early et al. | 307/467 |

OTHER PUBLICATIONS

Cooperman, "High Speed Current Mode Logic for LSI", IEEE Tranactions on Circuits and Systems, vol. CAS 127, No. 7, Jul. 1980, pp. 626-635.

Skokan, "Emitter Function Logic-Logic Family for LSI", IEEE Journal of Solid State Circuits, vol. SL-8, No. 5, Oct. 1973, pp. 356-361.

Gascoigne, "Logic Circuit Can Realise Any Boolean Function of Three Variables", Electronic Engineering, vol. 42, No. 513, Nov. 1970, pp. 69-72.

Hurst, "Universal Logic Gates in Custom-Designed I.C. Applications", International Conference on Computer Aided Design and Manufacture of Electronic Components, Circuits and Systems (Brighton, England), Jul. 3-6, 1979, pp. 61-65.

"Cascode Current Switch, Latched Input", IBM Technical Disclosure Bulletin, vol, 21, No. 6, Nov. 1978 by R. D. Burke, p. 2406.

"Low Power Write Circuit for Fast VLSI Arrays" by R. D. Dussault et al, IBM Technical Disclosure Bulletin, vol. 24, No. 11A, Apr. 1982, p. 5630.

Primary Examiner—James W. Moffitt
Assistant Examiner—Glenn A. Gossage
Attorney, Agent, or Firm—Wesley DeBruin

[57] ABSTRACT

An electronically selectable high performance data path switch which allows one input to drive two data buses or to have two inputs drive the two independently.

12 Claims, 5 Drawing Figures

DUAL MODE LOGIC CIRCUIT FOR A MEMORY ARRAY

CROSS-REFERENCE TO RELATED APPLICATION

U.S. patent application Ser. No. 597,958 entitled "Electronically Selectable Redundant Array (ESRA)", filed Apr. 9, 1984 by M. T. McMahon, Jr., and of common assignee herewith.

U.S. patent application Ser. No. 625,426 entitled "Improved Gate Array Chip" filed June 28, 1984 by E. F. Culican et al, and of common assignee herewith.

U.S. patent application Ser. No. 624,888 entitled "Improved Random Access Memory RAM Employing Complementary Transistor Switch (CTS) Memory Cells", filed June 25, 1984, by Y. H. Chan et al, and of common assignee herewith.

U.S. patent application Ser. No. 624,486 entitled "Voltage Mode Operation Scheme for BiPolar Arrays" by Y. H. Chan, and of common assignee herewith.

U.S. patent application Ser. No. 611,817 entitled "Self Contained Array Timing", filed May 18, 1984 by W. S. Klara et al.

U.S. patent application Ser. No. 666,580 entitled "Directory Memory System" filed Oct. 30, 1984, by J. E. Andersen, R. L. Barry, K. E. Christie and D. J. Shea and of common assignee herewith.

BACKGROUND OF THE INVENTION

1. Field of the Invention

The invention relates to a dual mode logic circuit and more particularly to a dual mode logic circuit employed in a memory array.

2. Background of Prior Art

A number of logical gate switching networks, in particular series coupled switching networks with asymmetric control, utilizing emitter coupled logic (or current switch) technology are known to the art.

Background Art

The following patents and publications are directed to dual mode logic circuitry and circuitry and subsystems utilizing same. It is to be appreciated that the following art is not submitted to be the only, the best or the most pertinent art.

Patents

U.S. Pat. No. 3,333,113 entitled "Switching Circuit Producing Output at One of Two outputs or Both outputs" granted July 25, 1967 to R. H. Cole et al.

U.S. Pat. No. 3,446,989 entitled "Multiple Level Logic Circuitry" granted May 27, 1969 to F. G. Allen et al.

U.S. Pat. No. 3,681,614 entitled "ECL Gate Switching Netword" granted Aug. 1, 1972 to F. Kroos.

U.S. Pat. No. 3,778,243 entitled "Monolithic Memory Sense Amplifier/Bit Driver Having Active Bit/Sense Line Pull-Up" granted Jan. 29, 1974 to N. M. Donofrio et al.

U.S. Pat. No. 3,906,212 entitled "Series-Coupled Emitter Coupled Logic (ECL) Circuit Having a Plurality of Independently Controllable Current Paths in a Lower Plane" granted Sept. 16, 1975 to D. Poguntke.

U.S. Pat. No. 3,925,691 entitled "Cascode Node Idle Current Injection Means" granted Dec. 9, 1975 to J. R. Gaskill, Jr. et al.

U.S. Pat. No. 3,942,033 entitled "Current Mode Logic Circuit" granted Mar. 2, 1976 to F. J. Swiatowiec et al.

U.S. Pat. No. 4,066,915 entitled "Memory Circuit" granted Jan. 3, 1978 to I. Ohhinata.

U.S. Pat. No. 4,070,657 entitled "Current Mode Simultaneous Dual-Read/Single-Write Memory Device" granted Jan. 24, 1978 to D. L. Fett.

U.S. Pat. No. 4,099,070 entitled "Sense-Write Circuit for Random Access Memory" granted July 4, 1978 to J. R. Reinert.

U.S. Pat. No. 4,110,639 entitled "Address Buffer For High Speed Semiconductor Memory" granted Aug. 29, 1978 to D. J. Redwine.

U.S. Pat. No. 4,125,877 entitled "Dual Port Random Access Memory Storage Cell" granted Nov. 14, 1978 to J. R. Reinert.

U.S. Pat. No. 4,149,099 entitled "Amplifier Circuit for Obtaining True and Complementary Output Signals from an Input Signal" granted Apr. 10, 1979 to A. Nagami.

U.S. Pat. No. 4,215,418 entitled "Integrated Digital Multiplier Circuit Using Current Mode Logic" granted July 29, 1980 to J. J. Muramatsu.

U.S. Pat. No. 4,274,017 entitled "Cascode Polarity Hold Latch Having Integrated Set/Reset Capability" granted June 16, 1981 to E. L. Carter et al.

U.S. Pat. No. 4,280,070 entitled "Balanced Input Buffer Circuit for Semiconductor Memory" granted July 21, 1981 to E. A. Reese et al.

Publications

[IBM Technical Disclosure Bulletin (IBM TDB)]

"Cascode Current Switch, Latched Input, 2-Bit Partitioned Decoder" by R. D. Burke, IBM TDB Vol. 21, No. 6, November 1978, pages 2406–7.

"Low Power Write Circuit for Fast VLSI Arrays" by R. D. Dussault et al, IBM TDB Vol. 24, No 11A, April, 1982, pages 5630–1.

The basic element of the so-called emitter coupled logic (ECL) family or technology, as is well known, is a differential amplifier having two emitter-coupled transistors which are oppositely and alternately brought into a block or a conductive state by control of the base of one of the two transistors through the use of a binary signal, saturation of either transistor, during conduction, being prevented by means of suitable current regulation. As the regulated current is conducted over one or the other transistor, depending upon the input signal, such type of circuit has sometime been termed a current transfer circuit.

An OR-NOR linkage of several input variables can be achieved if the collector-emitter paths of further transistors are circuited parallel to the collector-emitter path of the directly-controlled transistor of the differential amplifier. Other logical functions can be realized in an advantageous manner (with short data transit times and low current consumption) by so-called "series coupling" or "cascoding". (See for example three following publication and patents: (1) compare "The Electronic Engineer", November 1967, pages 56–60; (2) U.S. Pat. No. 2,964,652 entitled "Transistor Switching Circuits" granted Dec. 13, 1960 to Hannon S. Yourke and of common assignee herewith; and (3) U.S. Pat. No. 3,040,192 entitled "Logic, Exclusive-OR and Shift Register Circuits Utilizing Directly Connected Cascade Transistors in 'Tree' Configuration", granted June 19, 1962 to E. J. Slobodzinski and of common assignee herewith.)

The designation "series coupling" or cascade connected refers to a series connection of differential amplifiers in such manner that the transistors of a "lower" differential amplifier are inserted into the supply lines of the emitter of the transistors of differential amplifiers which are taken together in pairs and which may now be called the "upper" amplifiers. A controllable current path of the "lower" differential amplifier or both of them are thus split into two also oppositely-controlled current paths by the "upper" differential amplifiers. If necessary, the collectors of two transistors which do not belong to the same differential amplifier may be suitably connected and supplied with operational voltage over a common collector resistance.

One form of logically linking two input variables by means of a simple ECL switching network is also illustrated in U.S. Pat. Nos. 3,504,192 and 3,515,904. (U.S. Pat. No. 3,504,192 entitled "Emitter-Coupled Logic Circuit" granted Mar. 31, 1970 to Herbert Stopper and U.S. Pat. No. 3,515,904 entitled "Electronic Circuits Utilizing Emitter Coupled Transistors" granted June 2, 1970 to Herbert Stopper.) In both of the afore identified patents it is proposed to supply the bases of both transistors of a differential amplifier stage with different input signals, in which however, the potential of one input signal must preferably be shifted over half of the signal range in order to obtain clear, logical states at the output.

The present invention is directed to an improved dual mode circuit employing differential circuit means.

SUMMARY OF THE INVENTION

An electronically selectable high performance data path switch which allows one input to drive two data buses or to have two inputs drive the two independently.

The circuit in accordance with the invention accomplishes the required high performance data path switching with high speed and efficiency. It (1) has virtually no additional delay over a current switch emitter-follower (CSEF); (2) uses no more power than the two CSEFs it replaces (if only the second mode were implemented); (3) uses only two more transistors than two CSEFs; and (4) has a topology which allows four transistors to be integrated into two (T2 and T3).

The foregoing and other objects, features and advantages of the invention will be apparent from the following more particular description of preferred embodiments of the invention, as illustrated in the accompanying drawings.

Figure 4:
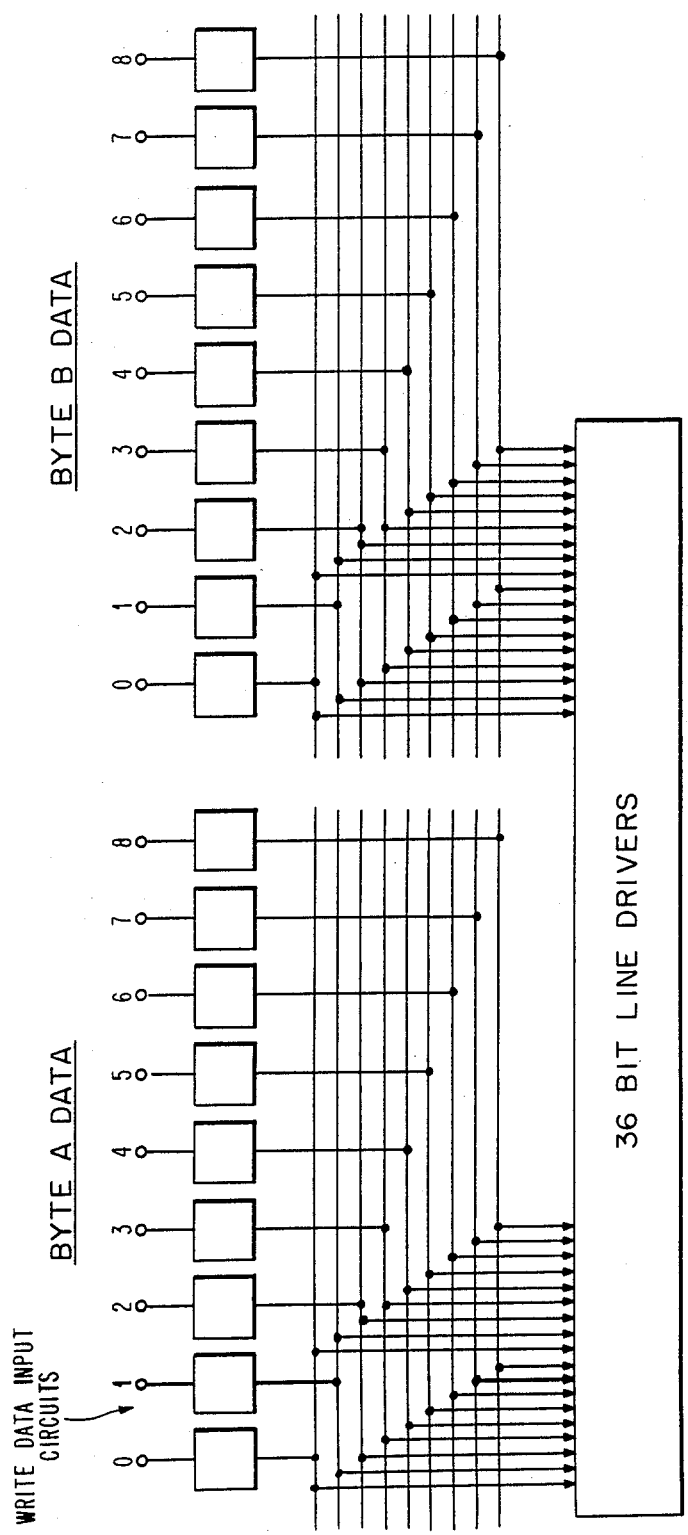
FIG. 4 (for reference purposes) is a known block diagram of a two byte wide data input organization using standard write data input circuits.
Figure 5:
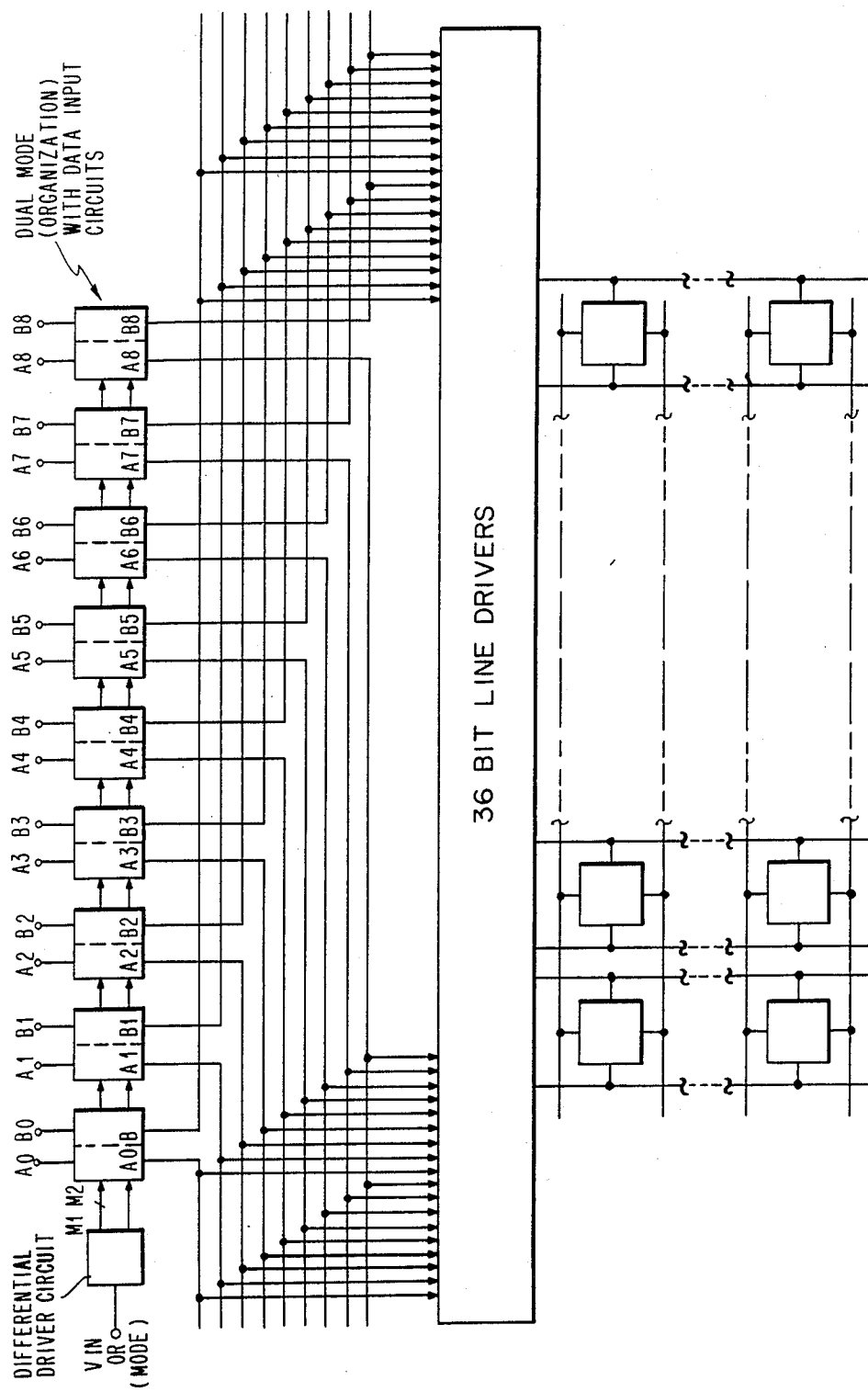

FIG. 5 is a block diagram of a dual mode or dual organization (one or two byte wide) write data input organization in accordance with the invention. This organization utilizes the disclosed dual mode (organization) write data input circuits and the associated differential driver circuit. The circuits in FIG. 5 can be electronically configured to operate as the circuits in FIG. 3 or FIG. 4 by switching VIN (mode) to the appropriate binary input level.

DESCRIPTION OF THE PREFERRED EMBODIMENTS

The dual mode circuit receives two independent input logic signals, and drives two sets of on-chip circuitry such that in one mode input A drives outputs A and B (in phase) and in a second mode input A drives output A and input B drives output B (in phase). The circuit makes possible, as more fully disclosed hereinafter, a dual-mode write organization on a random access memory chip with the same speed and power that a single mode (fixed double-byte) write scheme would exhibit.

The dual mode circuit is most efficiently realized in terms of power consumption, total device count and the number of stages of delay using cascoding and collector dotting of current switch circuits. The mode of the circuit is established by switching M1 and M2, the lower portion of the cascoded current switch.

If M1 is high compared to M2, the mode of the circuit is as follows: The constant current from T10 flows through T5 instead of T6 which activates the current switch formed by T2B and T3A and deactivates the T3B and T4 current switch. The T1 and T2A current switch is always active. In this configuration, the integrated transistor T2A and B controls both outputs A0 and B0. If input A is low compared to $V_{REF}$, T1 and T3A turn on, T2 turns off, nodes 1 and 2 are pulled down which results in low outputs A0 and B0. If input A is high, T2 turns on which allows nodes 1, 2, and outputs A0 and B0 to rise. Note that in this mode the B input has no effect on the circuit.

In the other mode, M2 is higher than M1, which turns on T6 and turns off T5. In this way the B input instead of the A input will control the B0 output since the T3B and T4 current switch is active. The A input still controls the A0 output since T9 is always on.

In review, it can be seen that in either mode there is no wasted control current other than base drive. That is that all current is used to generate the required data signal levels. The circuit is therefore efficient from a power consumption standpoint.

It can also be seen that the signal delay path in either mode is that of a single current switch emitter follower—that is in the path from a data input to a data output.

The second mode required that T5 and T6 be added and that second emitters be integrated into T2 and T3. Therefore the circuit is efficient from a total device count standpoint.

A secondary advantage of integrating the second emitters (instead of using separate transistor simply wired into the circuit) particularly with regards to T3 is that the capacitance on node 2 (R2-T3 collector-T8 base) is minimized by adding only an incremental capacitance (compared to T1) to the collector to substrate capacitance of T3 and the collector to base capacitance of T3 (associated with integrating the second emitter). Using separate transistors would have doubled those capacitances. The disclosed circuit therefore has virtually the same delay in the A0 and B0 output data paths. Minimizing any performance skew is important.

If T5 and T6 conduct a "unit" of current each, note that R1 and R2 will conduct 0 or 1 unit of current, in a different topology (i.e. an inverting circuit) R1 or R2 would have 0,1 or 2 units of current which would have required a clamp on R1 or R2 to prevent saturation and maintain the binary nature of this circuit.

Also note that R3 may be reduced to zero ohms if a higher up level is required at outputs A0 and B0.

Figure 2:
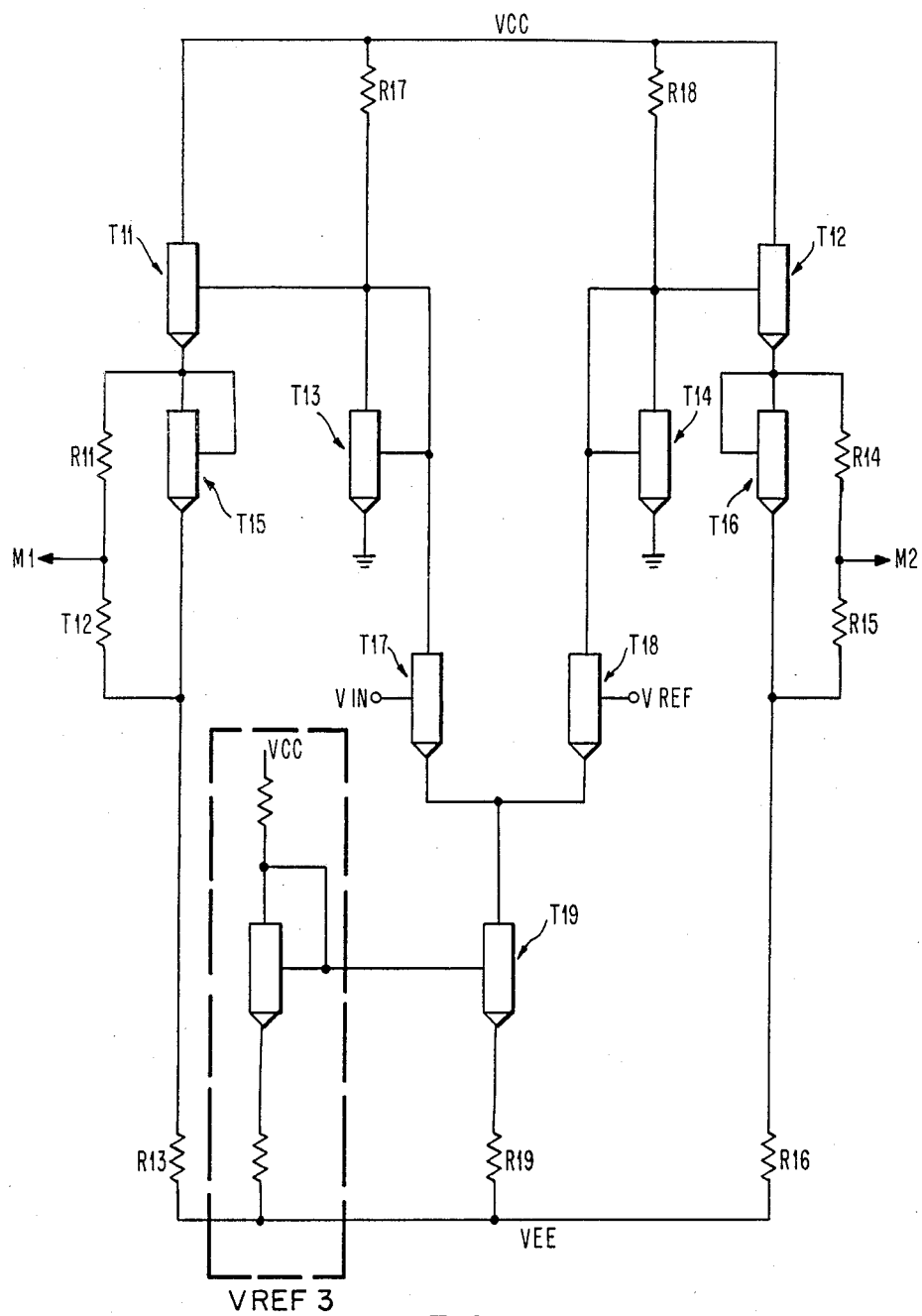
FIG. 2 is a circuit diagram of a differential driver circuit for the dual mode circuit of FIG. 1.

The circuit shown in FIG. 2 may be employed to provide the mode control inputs M1 and M2.

In high performance integrated circuitry it is necessary to employ a minimum power supply spread ($V_{CC} - V_{EE}$) in order to optimize the circuit power-delay product. The lower the power supply spread, the more difficult it is to obtain sufficient logic swings (i,e, noise margins). The prior art use of cascoding in current switch emitter follower (CSEF) circuitry aggravated the problem, because the devices of the lower cascode will be operated close to saturation.

The driver circuit FIG. 2 drives the lower cascode devices differentially while providing sufficient tracking to insure adequate noise margins and avoid saturation over the anticipated range of temperature, power supply, and process variations.

Figure 1:
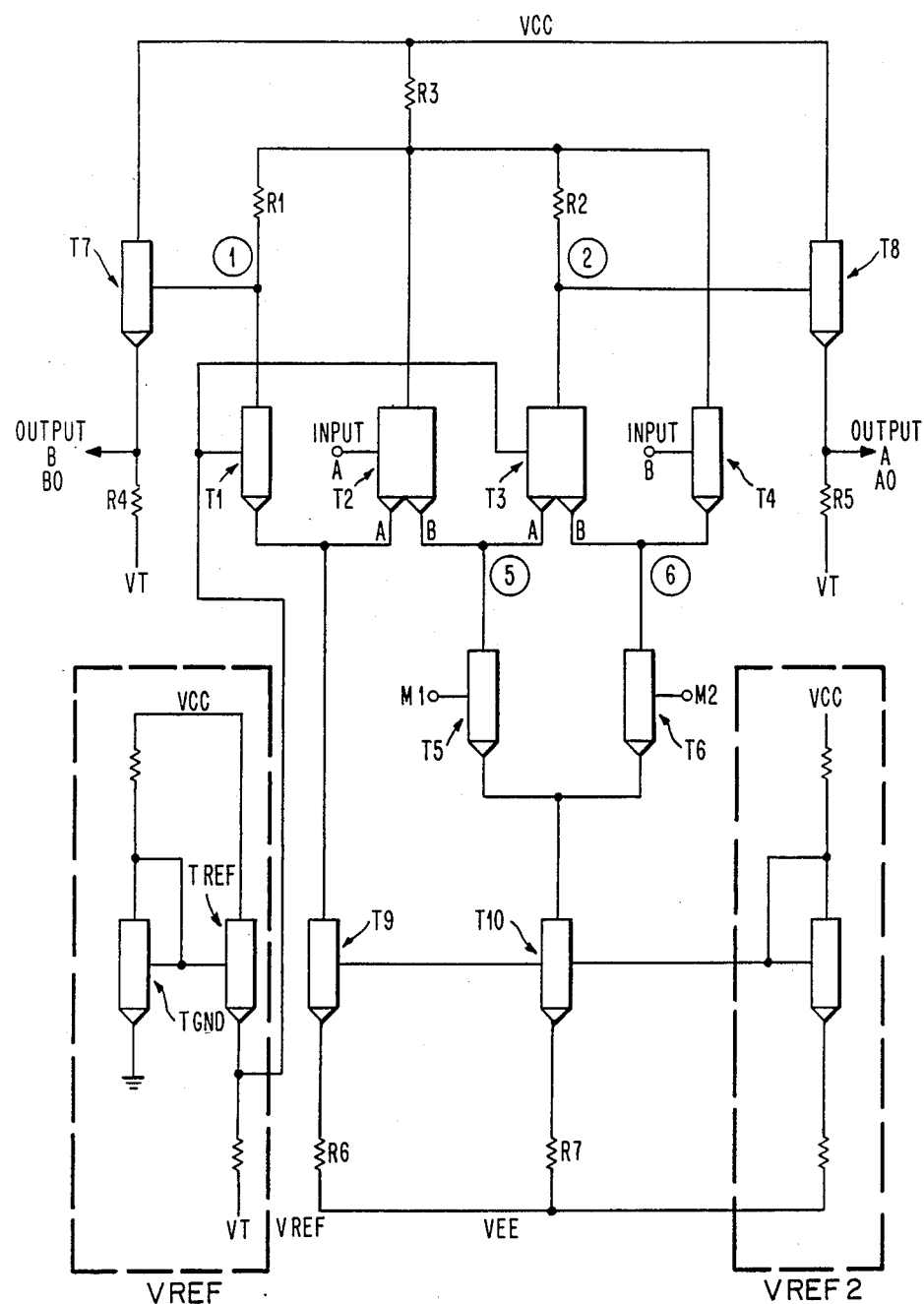
FIG. 1 is a circuit diagram of the dual mode (organization) write data input circuit in accordance with the invention.

Referring to FIG. 2 the outputs of this circuit drive the lower cascode devices (T5 and T6) of FIG. 1 differentially at nodes M1 and M2. In order to optimize the noise margin, the "high" levels of M1 and M2 are operated as close to $V_{REF}$ as possible without causing saturation of T5, T6 or T10 of FIG. 1. The required level of tracking is obtained as follows:

In FIG. 1, the voltage at node 5, $V_5$, is (with Input A at a "low" level).

$$V_5 = GND + V_{BE}(TGND) - V_{BE}(TREF) - V_{BE}(T3) \quad \text{Eq. (1)}$$

In equation (1) ground is explicitly shown to emphasize its effect on $V_5$. To simplify the design, the second-order effects of VCC, VEE, and VT are ignored. When input A is at a "high" level, node A will be higher than node M1 and no saturation of T5 is possible.

Referring back to FIG. 2, this circuit is required to drive a "high" level at node M1 which has the same tracking relationship as that of equation (1), namely, GND plus one base-emitter voltage minus two base-emitter voltages (again, neglecting VCC, VEE and VT tracking).

If the input of FIG. 2 ($V_{IN}$) is "low", T17 if OFF and T13 is ON, clamping the base of T11, and thus setting the "high" level at node M1 by the relationship $$V_{M1} = GND + V_{BE}(T13) - V_{BE}(T11) - \frac{R11}{R11 + R12}(V_{BE}(T15)) \quad \text{Eq. (2)}$$

Equation (2) exhibits the same tracking relationship as equation (1). Thus, with $V_{M1}$ tracking with $V_5$ of equation (1), T5 of FIG. 1 is kept out of saturation. R11 and R12 are employed to set the "high" level Of $V_{M1}$ precisely in order to take full advantage of the tracking obtained by the circuit of FIG. 2. In order for the tracking relationships between equations (1) and (2) to be maintained, it is necessary that R11 and R12 track, which is equivalent to stating that most of $V_{BE}(T15)$ is used to set the "high" level at node M1. Equation (2) does not introduce resistor tracking because the ratio of resistors on a chip remains nearly constant.

The above discussion applies to the tracking relationship between node 6 of FIG. 1 and node M2 as well. That is, with $V_{IN}$ of FIG. 2 at a "high" level, one may substitute T12, T14, T16, T18, R14 and R15 for T11, T13, T15, T17, R11 and R12 of FIG. 2 and T6 and node 6 for T5 and node 5 of FIG. 1.

Figure 3:
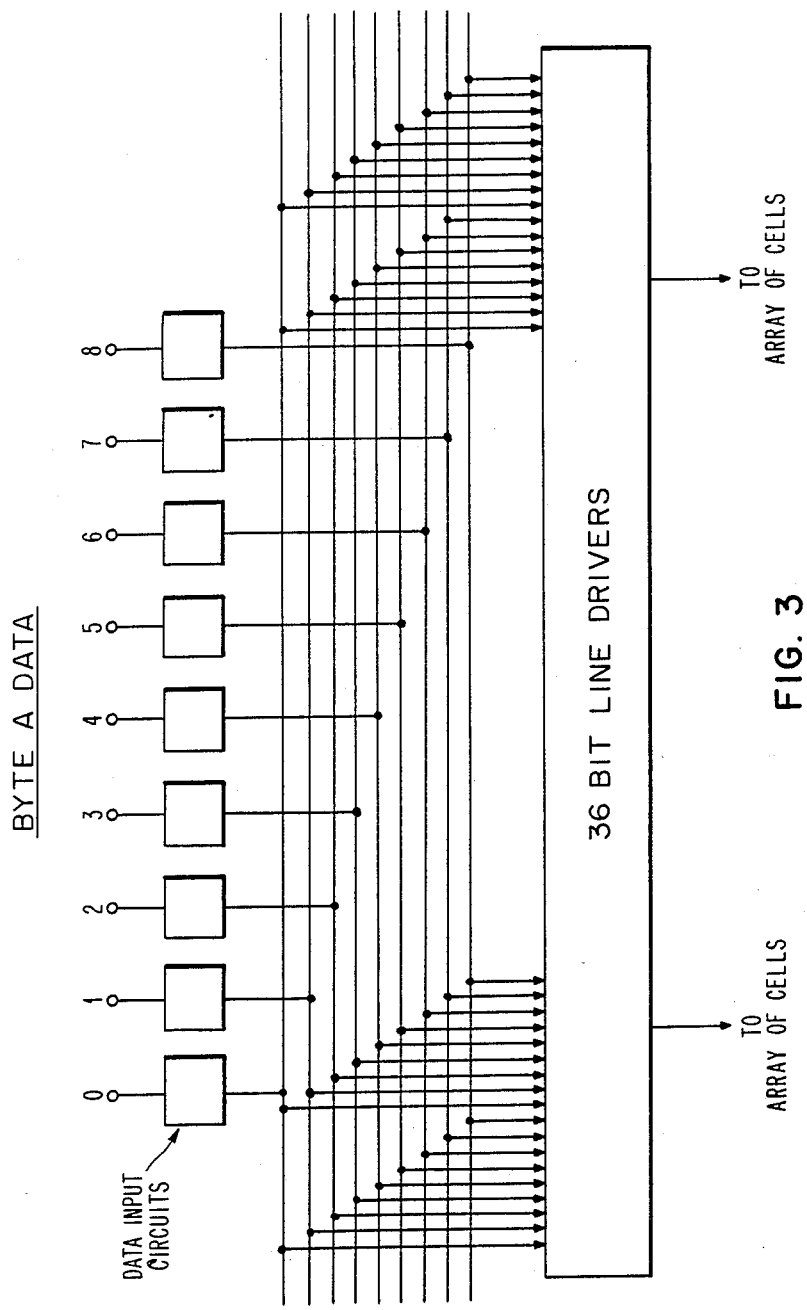
FIG. 3 (for reference purposes) is a known block diagram of a one byte wide write data input organization using standard write data input circuits.

FIG. 3 shows a configuration of nine simple write data input circuits wired to feed 36 bit line drivers which would feed an array of memory cells with 36 bit columns (i.e. bit line pairs).

FIG. 4 shows a configuration of 18 simple write data input circuits wired to feed 36 bit line drivers which would feed an array of memory cells with 36 bit columns (i.e. bit line pairs).

FIG. 5 discloses, in accordance with the invention, the wiring necessary to connect nine of the disclosed dual mode (organization) write data input circuits and the associated differential driver circuit to 36 bit line drivers which would feed an array of memory cells with 36 bit columns (i.e. bit line pairs) such that the binary input state of VIN (mode) (set to a logic "0" level low potential) would electronically configure the circuits to operate as the reference circuits shown in FIG. 3 or if VIN is switched to its other state (a logic "1" level high potential) would electronically configure the circuits to operate as the reference circuits in FIG. 4.

While the invention has been particularly shown and described with reference to preferred embodiments thereof, it will be understood by those skilled in the art that the foregoing and other charges in form and details may be made therein without departing from the spirit and scope of the invention.

What is claimed is:

1. A dual mode circuit provided by cascode collector dotted current switch circuit means; said cascode collector dotted current switch circuit means comprising:
    first current switch circuit means adapted to receive a first binary input (A);
    second current switch circuit means interconnected with said first current switch circuit means, said second current switch circuit means being adapted to receive a second binary input (B);
    third current switch circuit means interconnected with said first and second current switch circuit means, said third current switch circuit means being adapted to receive binary inputs M1 and M2, where M1 is the binary complement of M2; and
    first and second output means connected to said first and second current switch circuit means, said first and second output means respectively rendering a binary output A0 and a binary output B0, whereby when input M1 is high compared to input M2 outputs A0 and B0 are solely controlled by input A and when input M2 is high compared to M1, input B will control output B0 and input A will control output A0.

2. A dual mode write data in circuit for controlling a "write operation" in a memory array, said circuit comprising:
    first, second, third, fourth, fifth, sixth, seventh and eighth transistors, said first through eighth transistors each having an emitter, base and collector;
    ninth and tenth transistors, said ninth and tenth transistors each having first and second emitters, a base, and a collector;
    said collector of said seventh transistor and said collector of said eighth transistor being respectively connected to a first potential;

said base of said seventh transistor being connected to said collector of said first transistor;

said base of said eighth transistor being connected to said collector of said tenth transistor;

said emitter of said first transistor, said first emitter of said ninth transistor and said collector of said sixth transistor being connected in common;

said second emitter of said ninth transistor, said first emitter of said tenth transistor and said collector of said third transistor being connected in common;

said second emitter of said tenth transistor, said emitter of said second transistor and said collector of said fourth transistor being connected in common;

said emitter of said third transistor, said emitter of said fourth transistor and said collector of said fifth transistor being connected in common, said base of said first transistor and said base of said tenth transistor each being connected to a first reference potential;

said base of said fifth transistor and said base of said sixth transistor each being connected to a second reference potential;

a first resistor connected between said collector of said first transistor and said collector of said ninth transistor;

a second resistor connected between said eollector of said tenth transistor and said collector of said ninth transistor;

a third resistor connected between said first potential and a common connection of said collector of said ninth transistor and said collector of said second transistor;

a fourth resistor connected between said emitter of said seventh transistor and a second potential;

a fifth resistor connected between said emitter of said eighth transistor and said second potential;

a sixth resistor connected between said emitter of said sixth transistor and a third potential;

a seventh resistor connected between said emitter of said fifth transistor and said third potential;

circuit means for impressing a binary input A on said base of said ninth transistor, a binary input B on said base of said second transistor, a binary input M1 on said base of said third transistor and a binary input M2 on said base of said fourth transistor, said binary inputs M1 and M2 being binary complements of one another; and first and second output terminals, said first output terminal being connected to said emitter of said seventh transistor and providing a binary output B0, said second output terminal being connected to said emitter of said eighth transistor and providing a binary output A0, said binary outputs A0 and B0 being respectively under sole control of said binary input A when M1 is high, said binary output A0 being under sole control of said binary input A when M2 is high, and said binary output B0 being under sole control of said binary input B when M2 is high.

3. A dual mode write data in circuit for controlling a "write operation" in a memory array, said circuit comprising:

first, second, third, fourth, fifth, sixth, seventh and eighth transistors, said first through eighth transistors each having an emitter, base and collector;

ninth and tenth transistors, said ninth and tenth transistors each having first and second emitters, a base, and a collector;

said collector of said seventh transistor and said collector of said eighth transistor being respectively connected to a first potential;

said base of said seventh transistor being connected to said collector of said first transistor;

said base of said eighth transistor being connected to said collector of said tenth transistor;

said emitter of said first transistor, said first emitter of said ninth transistor and said collector of said sixth transistor being connected in common;

said second emitter of said ninth transistor, said first emitter of said tenth transistor and said collector of said third transistor being connected in common;

said second emitter of said tenth transistor, said emitter of said second transistor and said collector of said fourth transistor being connected in common;

said emitter of said third transistor, said emitter of said fourth transistor and said collector of said fifth transistor being connected in common, said base of said first transistor and said base of said tenth transistor each being connected to a first reference potential;

said base of said fifth transistor and said base of said sixth transistor each being connected to a second reference potential;

a first resistor connected between said collector of said first transistor and said collector of said tenth transistor;

a second resistor connected between said collector of said tenth transistor and said collector of said ninth transistor;

a third resistor connected between said first potential and a common connection of said collector of said ninth transistor and said collector of said second transistor;

a fourth resistor connected between said emitter of said seventh transistor and a second potential;

a fifth resistor connected between said emitter of said eighth transistor and said second potential;

a sixth resistor connected between said emitter of said sixth transistor and a third potential;

a seventh resistor connected between said emitter of said fifth transistor and said third potential;

circuit means for impressing a binary input A on said base of said ninth transistor, a binary input B on said base of said second transistor, a binary input M1 on said base of said third transistor and a binary input M2 on said base of said fourth transistor, said binary inputs M1 and M2 being binary complements of one another;

first and second output terminals, said first output terminal being connected to said emitter of said seventh transistor and providing a binary output B0, said second output terminal being connected to said emitter of said eighth transistor and providing a binary output A0, said binary outputs A0 and B0 being respectively under sole control of said binary input A when M1 is high, said binary output A0 being under sole control of said binary input A when M2 is high, and said binary output B0 being under sole control of said binry input B when M2 is high; and said dual mode write data in circuit being further characterized by the inclusion of a driver circuit for driving the dual mode write data in circuit, said driver circuit comprising:

eleventh, twelfth, thirteenth, fourteenth, fifteenth, sixteenth, seventeenth, eighteenth and nineteenth transistors, each of said eleventh through nineteenth transistors having an emitter, base and collector;

said collector of said eleventh transistor and said collector of said twelfth transistor being respectively connected to said first potential;

an eighth resistor connected between the base and collector of said eleventh transistor;

a ninth resistor connected between the base and collector of said twelfth transistor;

a first common connection connecting in common said base of said eleventh transistor, said collector of said thirteenth transistor, said base of said thirteenth transistor and said collector of said seventeenth transistor;

a second common connection connecting in common said base of said twelfth transistor, said collector of said fourteenth transistor, said base of said fourteenth transistor and said collector of said eighteenth transistor;

a third common connection connecting in common said emitter of said seventeenth transistor, said emitter of said eighteenth transistor and said collector of said nineteenth transistor;

said base of said eighteenth transistor being connected to a third reference potential;

said base of said seventeenth transistor being adapted to receive a binary input (VIN);

said base of said nineteenth transistor being connected to a fourth reference potential;

a fourth common connection connecting in common said emitter of said eleventh transistor, said collector of said fifteenth transistor and said base of said fifteenth transistor;

a tenth resistor connected between said emitter of said fifteenth transistor and said second potential;

a fifth common connection connecting in common said emitter of said twelfth transistor, said collector of said sixteenth transistor and said base of said sixteenth transistor;

an eleventh resistor connected between said emitter of said sixteenth transistor and said second potential;

a first output terminal M1 coupled to said emitter of said fifteenth transistor; and a second output terminal M2 coupled to said emitter of said sixteenth transistor; and a twelfth resistor connected between said emitter of said nineteenth transistor and said second potential.

4. A dual mode circuit provided by cascode collector dotted current switch circuit means; said cascode collector dotted current switch circuit means comprising:

first current switch circuit means adapted to receive a first binary input (A);

second current switch circuit means adapted to receive a second binary input (B);

third current switch circuit means interconnected with said first and second current switch circuit means, said third current switch circuit means being adapted to also receive said first binary input (A);

fourth current switch circuit means interconnected with said second and third current switch circuit means, said fourth current switch circuit means being adapted to receive binary inputs M1 and M2, where M1 is the binary complement of M2; and first and second output means connected to with said first, second and third current switch circuit means, said first and second output means respectively rendering a binary output A0 and a binary output B0, whereby when input M1 is high compared to input M2 outputs A0 and B0 are solely controlled by input A and when input M2 is high compared to M1, input B will control output B0 and input A will control output A0.

5. In a read/write memory array having an array of m×n memory cells, where m and n are positive integers, said m×n array of memory cells being arranged in m columns and n rows of memory cells wherein each of said m columns has n memory cells and each of said n rows of memory cells has m memory cells, m pairs of bit lines, each pair of said m pairs of lines being connected to the n memory cells of a discrete predetermined one of said m columns of memory cells, n pairs of word lines, each pair of said n pairs of word lines being connected to the m memory cells of a discrete predetermined one of said n rows of memory cells, and m bit line driver circuits, each of said m bit line driver circuits being connected to a discrete predetermined one of said m pairs of bit lines, said memory being characterized by the inclusion of the following circuitry:

m/4 dual mode write data in circuits, each of said dual mode write data in circuits having a first binary input (A), a second binary input (B), a third input (M1) and a fourth input (M2) where M1 and M2 are respectively binary complements of one another, a first output A0 and a second output B0, each of said m/4 dual mode write data in circuits including cascode collector dotted current switch circuit means interconnecting said A, B, M1 and M2 inputs and said first and second outputs A0 and B0 each of said dual mode write data in circuit means being characterized in that (1) when input M1 is high, input A controls outputs A0 and B0 and (2) when input M2 is high, input A controls output A0 and input B controls output B0:

first connection means for connecting said A0 outputs of said m/4 dual mode write data in circuits to a first group of m/2 of said m driver circuits;

second connection means for connecting said B0 outputs of said m/4 dual mode write data in circuits to a second group of m/2 of said m driver circuits, where said first and second groups of m/2 driver circuits are separate and distinct;

control circuit means connected to said third (M1) and fourth (M2) inputs of each of said m/4 dual mode write data in circuits, whereby under a first condition (M1 high) the A inputs of the m/4 dual mode control data-in circuits will control the A0 and B0 outputs of the m/4 dual mode write data in circuits and under a second condition (M2 high) the A inputs of the m/4 dual control write data in circuits will control the A0 outputs of the m/4 dual mode write data-in circuits and the B inputs of the m/4 dual control write data in circuits will control the B0 outputs of the m/4 dual mode write data-in circuits, and wherein said m/4 binary inputs A of said m/4 dual mode write data in circuits constitute a first binary byte, or word, of data having m/4 binary bits and said m/4 binary inputs B of said m/4 dual mode write data in circuits constitute a second binary byte, or word, of data having m/4 binary bits.

6. In a read/write memory array having an array of m×n memory cells, wherein m and n are positive integers, said m×n array of memory cells being arranged in m columns and n rows of memory cells wherein each of said m columns has n memory cells and each of said n rows of memory cells has m memory cells, m pairs of bit lines, each pair of said m pairs of lines being connected to the n memory cells of a discrete predetermined one of said m columns of memory cells, n pairs of word lines, each pair of said n pairs of word lines being connected to the m memory cells of a discrete predetermined one of said n rows of memory cells, and m bit line driver circits, each of said m bit line driver circuits being connected to a discrete predetermined one of said m pairs of bit lines, said memory being characterized by the inclusion of the following circuitry:

m/k dual mode write data in circuits, where k is a positive even integer and m≧k≧2, each of said dual mode write data in circuits having a first binary input (A), a second binary input (B), a third input (M1) and a fourth input (M2) where M1 and M2 are respectively binary complements of one another, a first output A0 and a second output B0, each of said m/k dual mode write data in circuits including cascode collector dotted current switch circuit means interconnecting said A, B, M1 and M2 inputs and said first and second outputs A0 and B0 each of said dual mode write data in circuit means being characterized in that (1) when input M1 is high, input A controls outputs A0 and B0 and (2) when input M2 is high, input A controls output A0 and input B controls output B0:

first connection means for connecting said A0 outputs of said m/k dual mode write data in circuits to a first group of m/2 of said m driver circuits;

second connection means for connecting said B0 outputs of said m/k dual mode write data in circuits to a second group of m/2 of said m driver circuits, where said first and second groups of m/2 driver circuits are separate and distinct;

control circuit means connected to said third (M1) and fourth (M2) inputs of each of said m/k dual mode write data in circuits, whereby under a first condition (M1 high) the A inputs of the m/k dual mode control data-in circuits will control the A0 and B0 outputs of the m/k dual mode write data in circuits and under a second condition (M2 high) the A inputs of the m/k dual control write data in circuits will control the A0 outputs of the m/k dual mode write data-in circuits and the B inputs of the m/k dual control write data in circuits will control the B0 outputs of the m/k dual mode write data-in circuits, and wherein said m/k binary inputs A of said m/k dual mode write data in circuits constitute a first binary byte, or word, of data having m/k binary bits and said m/k binary inputs B of said m/k dual mode write data in circuits constitute a second binary byte, or word of data having m/k binary bits.

7. In a read/write memory array having an array of m×n memory cells, where m and n are positive integers, said m×n array of memory cells being arranged in m columns and n rows of memory cells wherein each of said m columns has n memory cells and each of said n rows of memory cells has m memory cells, m pairs of bit lines, each pair of said m pairs of lines being connected to the n memory cells of a discrete predetermined one of said m columns of memory cells, n pairs of word lines, each pair of said n pairs of word lines being connected to the m memory cells of a discrete predetermined one of said n rows of memory cells, and m bit line driver circuits, each of said m bit line driver circuits being connected to a discrete predetermined one of said m pairs of bit lines, said memory being characterized by the inclusion of the following circuitry:

m/k dual mode write data in circuits, where k is a positive even integer and m≧k≧2, each of said dual mode write data in circuits having a first binary input (A), a second binary input (B), a third input (M1) and a fourth input (M2) where M1 and M2 are respectively binary complements of one another, a first output A0 and a second output B0, each of said m/k dual mode write data in circuits including cascode collector dotted current switch circuit means interconnecting said A, B, M1 and M2 inputs and said first and second outputs A0 and B0 each of said dual mode write data in circuit means being characterized in that (1) when input M1 is high, input A controls outputs A0 and B0 and (2) when input M2 is high, input A controls output A0 and input B controls output B0:

first connection means for connecting said A0 outputs of said m/k dual mode write data in circuits to a first group of m/2 of said m driver circuits;

second connection means for connecting said B0 outputs of said m/k dual mode write data in circuits to a second group of M/2 of said M driver circuits, where said first and second groups of m/2 driver circuits are separate and distinct; and control circuit means connected to said third (M1) and fourth (M2) inputs of each of said m/k dual mode write data in circuits, whereby under a first condition (M1 high) the A inputs of the m/k dual mode control data-in circuits will control the A0 and B0 outputs of the m/k dual mode write data in circuits and under a second condition (M2 high) the A inputs of the m/k dual control write data in circuits will control the A0 outputs of the m/k dual mode write data-in circuits and the B inputs of the m/k dual control write data in circuits will control the B0 outputs of the m/k dual mode write data-in circuits.

8. In a read/write memory array having an array of m×n memory cells, where m and n are positive integers, said m×n array of memory cells being arranged in m columns and n rows of memory cells wherein each of said m columns has n memory cells and each of said n rows of memory cells has m memory cells, m pairs of bit lines, each pair of said m pairs of lines being connected to the n memory cells of a discrete predetermined one of said m columns of memory cells, n pairs of word lines, each pair of said n pairs of word lines being connected to the m memory cells of a discrete predetermined one of said n rows of memory cells, and m bit line driver circuits, each of said m bit line driver circuits being connected to a discrete predetermined one of said m pairs of bit lines, said memory being characterized by the inclusion of the following circuitry:

m/4 dual mode write data in circuits, each of said dual mode write data in circuits having a first binary input (A), a second binary input (B), a third input (M1) and a fourth input (M2) where M1 and M2 are respectively binary complements of one another, a first output A0 and a second output B0, each of said m/4 dual mode write data in circuits including cascode collector dotted current switch circuit means interconnecting said A, B, M1 and M2 inputs and said first and second outputs A0 and B0 each of said dual mode write data in circuit means being characterized in that (1) when input M1 is high, input A controls outputs A0 and B0 and (2) when input M2 is high, input A controls output A0 and input B controls output B0:

first connection means for connecting said A0 outputs of said m/4 dual mode write data in circuits to a first group of m/2 of said m driver circuits;

second connection means for connecting said B0 outputs of said m/4 dual mode write data in circuits to a second group of m/2 of said m driver circuits, where said first and second groups of m/2 driver circuits are separate and distinct; and control circuit means connected to said third (M1) and fourth (M2) inputs of each of said m/4 dual mode write data in circuits, whereby under a first condition (M1 high) the A inputs of the m/4 dual mode control data-in circuits will control the A0 and B0 outputs of the m/4 dual mode write data in circuits and under a second condition (M2 high) the A inputs of the m/4 dual control write data in circuits will control the A0 outputs of the m/4 dual mode write data-in circuits and the B inputs of the m/4 dual control write data in circuits will control the B0 outputs of the m/4 dual mode write data-in circuits.

9. In a read/write memory array having an m×n array of memory cells, as recited in claim 7, or claim 8, wherein said cascode collector dotted current switch circuit means of each said dual mode write data in circuits comprises:

first current switch circuit means adapted to receive a first binary input (A);

second current switch circuit means adapted to receive a second binary input (B);

third current switch circuit means interconnected with said first and second current switch circuit means, said third current switch circuit means being adapted to also receive said first binary input (A);

fourth current switch circuit means interconnected with said second and third current switch circuit means, said fourth current switch circuit means being adapted to receive binary inputs M1 and M2, where M1 is the binary complement of M2; and first and second output means connected to said first, second and third current switch circuit means, said first and second output means respectively rendering a binary output A0 and a binary output B0, whereby when input M1 is high compared to input M2 outputs A0 and B0 are solely controlled by input A and when input M2 is high compared to M1, input B will control output B0 and input A will control output A0.

10. In a read/write memory array having an array of m×n memory cells, as recited in claim 7, or claim 8, wherein said cascode collector dotted current switch circuit means of each of said dual mode write data in circuits comprises:

first current switch circuit means adapted to receive a first binary input (A);

second current switch circuit means interconnected with said first current switch circuit means, said second current switch circuit means being adapted to receive a second binary input (B);

third current switch circuit means interconnected with said first and second current switch circuit means, said third current switch circuit means being adapted to receive binary inputs M1 and M2, where M1 is the binary complement of M2; and first and second output means connected to said first and second current switch circuit means, said first and second output means respectively rendering a binary output A0 and a binary output B0, whereby when input M1 is high compared to input M2 outputs A0 and B0 are solely controlled by input A and when input M2 is high compared to M1, input B will control output B0 and input A will control output A0.

11. In a read/write memory array having an array of m×n memory cells, as recited in claim 7, or claim 8, wherein each said dual mode write data in circuit comprises:

first, second, third, fourth, fifth, sixth, seventh and eighth transistors, said first through eighth transistors each having an emitter, base and collector;

ninth and tenth transistors, said ninth and tenth transistors each having first and second emitters, a base, and a collector;

said collector of said seventh transistor and said collector of said eighth transistor being respectively connected to a first potential;

said base of said seventh transistor being connected to said collector of said first transistor;

said base of said eighth transistor being connected to said collector of said tenth transistor;

said emitter of said first transistor, said first emitter of said ninth transistor and said collector of said sixth transistor being connected in common;

said second emitter of said ninth transistor, said first emitter of said tent transistor and said collector of said third transistor being connected in common;

said second emitter of said tenth transistor, said emitter of said second transistor and said collector of said fourth transistor being connected in common;

said emitter of said third transistor, said emitter of said fourth transistor and said collector of said fifth transistor being connected in common, said base of said first transistor and said base of said tenth transistor each being connected to a first reference potential;

said base of said fifth transistor and said base of said sixth transistor each being connected to a second reference potential;

a first resistor connected between said collector of said first transistor and said collector of said ninth transistor;

a second resistor connected between said collector of said tenth transistor and said collector of sid ninth transistor;

a third resistor connected between said first potential and a common connection of said collector of said ninth transistor and said collector of said second transistor;

a fourth resistor connected between said emitter of said seventh transistor and a second potential;

a fifth resistor connected between said emitter of said eighth transistor and said second potential;

a sixth resistor connected between said emitter of said sixth transistor and a third potential;

a seventh resistor connected between said emitter of said fifth transistor and said third potential;

circuit means for impressing a binary input A on said base of said ninth transistor, a binary input B on said base of said second transistor, a binary input M1 on said base of said third transistor and a binry input M2 on said base of said fourth transistor, said binary inputs M1 and M2 being binary complements of one another; and first and second output terminals, said first output terminal being connected to said emitter of said seventh transistor and providing a binary output B0, said second output terminal being connected to said emitter of said eighth transistor and providing a binary output A0, said binary outputs A0 and B0 being respectively under sole control of said binary input A when M1 is high, said binary output A0 being under sole control of said binary input A when M2 is high, and said binary output B0 being under sole control of said binary input B when M2 is high.

12. In a read/write memory array having an array of m×n memory cells, as recited in claim 7, or claim 8, wherein said control circuit means is a driver circuit comprising:

eleventh, twelfth, thirteenth, fourteenth, fifteenth, sixteenth, seventeenth, eighteenth and nineteenth transistors, each of said eleventh through nineteenth transistors having an emitter, base and collector;

said collector of said eleventh transistor and said collector of said twelfth transistor being respectively connected to said first potential;

an eighth resistor connected between the base and collector of said eleventh transistor;

a ninth resistor connected between the base and collector of said twelfth transistor;

a first common connection connecting in common said base of said eleventh transistor, said collector of said thirteenth transistor, said base of said thirteenth transistor and said collector of said seventeenth transistor;

a second common connection connecting in common said base of said twelfth transistor, said collector of said fourteenth transistor, said base of said fourteenth transistor and said collector of said eighteenth transistor;

a third common connection connecting in common said emitter of said seventeenth transistor, said emitter of said eighteenth transistor and said collector of said nineteenth transistor;

said base of said eighteenth transistor being connected to a third reference potential;

said base of said seventeenth transistor being adapted to receive a binary input (VIN);

said base of said nineteenth transistor being connected to a fourth reference potential;

a fourth common connection connecting in common said emitter of said eleventh transistor, said collector of said fifteenth transistor and said base of said fifteenth transistor;

a tenth resistor connected between said emitter of said fifteenth transistor and said second potential;

a fifth common connection connecting in common said emitter of said twelfth transistor, said collector of said sixteenth transistor and said base of said sixteenth transistor;

an eleventh resistor connected between said emitter of said sixteenth transistor and said second potential;

a first output terminal M1 coupled to said emitter of said fifteenth transistor; and a second output terminal M2 coupled to said emitter of said sixteenth transistor; and a twelfth resistor connected between said emitter of said nineteenth transistor and said second potential.

* * * * *